United States Patent
Afzali-Ardakani et al.

(10) Patent No.: US 11,024,512 B1
(45) Date of Patent: Jun. 1, 2021

(54) SELECTIVE ETCH FORMULATION FOR SILICON OXIDE

(71) Applicant: International Business Machines Corporation, Armonk, NY (US)

(72) Inventors: Ali Afzali-Ardakani, Ossining, NY (US); Benjamin Wymore, Cortlandt Manor, NY (US); David L. Rath, Stormville, NY (US); George G. Totir, Newtown, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/811,558

(22) Filed: Mar. 6, 2020

(51) Int. Cl.
*H01L 21/311* (2006.01)
*H01L 21/306* (2006.01)
*C09K 13/08* (2006.01)

(52) U.S. Cl.
CPC ........ *H01L 21/31111* (2013.01); *C09K 13/08* (2013.01); *H01L 21/30604* (2013.01)

(58) Field of Classification Search
CPC ......... H01L 21/31111; H01L 21/30604; C09K 13/08
See application file for complete search history.

(56) References Cited

U.S. PATENT DOCUMENTS

| | | | |
|---|---|---|---|
| 4,746,397 A | 5/1988 | Maeda et al. | |
| 5,213,621 A | 5/1993 | Ivankovits et al. | |
| 5,635,102 A | 6/1997 | Mehta | |
| 5,824,601 A * | 10/1998 | Dao | C09K 13/08 438/713 |
| 5,922,624 A | 7/1999 | Verhaverbeke et al. | |
| 6,159,859 A * | 12/2000 | Robertson, III | H01L 21/02049 438/706 |
| 7,030,034 B2 | 4/2006 | Fucsko et al. | |
| 8,512,587 B2 * | 8/2013 | Rana | H01L 21/31111 216/83 |
| 9,431,268 B2 | 8/2016 | Lill et al. | |
| 2019/0074188 A1 | 3/2019 | Cooper et al. | |

OTHER PUBLICATIONS

T. K. Whidden et al., "Nanoscale lithography of silicon dioxide using electron beam patterned carboxylic acids as localized etch initiators," Journal of the Electrochemical Society, vol. 144, No. 2, 1997, pp. 605-616.

M. N. Kozicki et al., "A novel nanoscale resist using 10-undecanoic acid monolayers on silicon dioxide." Microelectronic Engineering, vol. 47, No. 1-4, 1999, pp. 239-241.

* cited by examiner

*Primary Examiner* — Anita K Alanko

(74) *Attorney, Agent, or Firm* — Daniel P. Morris, Esq.; Hoffmann & Baron, LLP

(57) ABSTRACT

Enhanced compositions and methods are provided for selectively etching silicon wafers, which is particularly useful in the context of silicon wafer manufacturing and processing applications. Optionally, a formulation is provided which selectively etches silicon dioxide in preference to aluminum oxide. Optionally, a formulation and method are provided that is substantially non-aqueous.

16 Claims, No Drawings

SELECTIVE ETCH FORMULATION FOR SILICON OXIDE

BACKGROUND

The present invention relates generally to semiconductor processing, and more particularly to a composition and process for selectively cleaning and etching microelectronic substrates, including silicon wafers.

During the processing of silicon wafers, it is at some point necessary to remove impurities, including those such as native oxides of silicon in preference to underlying or adjacent dielectrics of different kinds.

Several methods of selectively etching silicon nitride in preference to silicon oxide have been attempted, most including a dry etch process in vacuum chambers. Some methods for texturing silicon includes loading a silicon wafer into a vacuum chamber, heating the silicon wafer and thermal cracking a gas to generate cracked sulfur species. The silicon wafer is exposed to the cracked sulfur species for a time duration in accordance with a texture characteristic needed for a surface of the silicon wafer.

Another method for texturing silicon includes cleaning a silicon wafer to remove oxide; loading the silicon wafer into a vacuum chamber; degassing the wafer to expose a clean Si surface; heating the silicon wafer in the vacuum chamber to a temperature greater than about 350 degrees C.; flowing thermally cracked sulfur species into the vacuum chamber; anisotropically etching the silicon wafer with the cracked sulfur species for a time duration in accordance with a texture characteristic needed for a surface of the silicon wafer; and exhausting volatile Si—S specifies generated by etching the silicon wafer.

In terms of wet etching, U.S. Pat. No. 5,824,601 to Dao, for example, provides for etching solutions and methods for etching of oxides in general and more specifically for the etching of silicon oxides as, for example, those used in sacrificial oxide layers in the fabrication of microstructures such as sensors and micromachines. The etching solutions of Dao are mixtures of a carboxylic acid and hydrogen fluoride (HF). The solutions are useful in and provide etch selectivity for silicon oxide relative to other materials, including metals, nitrides, and polysilicon, that form the structural components of typical microstructures. Dao, however, does not provide enough selectivity in its etching capabilities, and often falls short in terms of processing of silicon wafers because it does not show enough selectivity to remove silicon oxide in the presence of metal oxides.

SUMMARY

The present invention, as manifested in one or more embodiments thereof, relates to a composition and process for improving manufacturing of silicon wafers, particularly for selectively etching silicon wafers. Provided therefore is a selective etch composition for processing silicon wafers. The composition includes about 0.1% to about 5.5% by weight hydrogen fluoride (HF), about 45.0% to about 90.0% by weight of a carboxylic acid composition, and about 5.0% to about 50.0% by weight of trifluoroacetic acid anhydride.

In an embodiment, the composition includes trifluoroacetic acid anhydride in about 10.0% to about 50.0% by weight of the composition. In another embodiment, the triflruoroacetic acid anhydride is present in about 15.0% to about 50.0% by weight of the composition.

In an embodiment, the composition includes hydrogen fluoride from about 1.0% to about 5.0% by weight of the composition, carboxylic acid is present from about 65.0% to about 80.0% by weight of said composition, and trifluoroacetic acid is present from about 15.0% to about 50.0% by weight. In yet another embodiment, the composition includes hydrogen fluoride from about 1.0% to about 5.0% by weight of the composition; said carboxylic acid is present in said composition from about 75.0% to about 78.0% by weight of said composition, and said trifluoroacetic acid is present in said composition from about 20.0% to about 45.0% by weight.

In yet another embodiment, the present invention includes compositions wherein the carboxylic acid is selected from the group of acetic acid, propionic acid, citric acid, butyric acid, hexanoic acid, or mixtures thereof. In another embodiment, the carboxylic acid of the composition comprises acetic acid. In another embodiment, the ratio of the carboxylic acid composition to trifluoracetic acid is about 10:1 to about 1:1 in the compositions of the present invention. In another embodiment, the ratio of the carboxylic acid composition to trifluoroacetic acid is about 10:1 to about 5:1.

In an embodiment, the composition has a pH in the range of between about 1.0 and about 4.0. In another embodiment, the composition of the present invention is non-aqueous. In another embodiment, the composition of the present invention includes one or more ingredients selected from the group comprising a pH-adjusting agent, a corrosion control agent, and a surfactant.

In an embodiment, the composition of the present invention selectively removes silicon oxide over aluminum oxide in processing silicon wafers. In another embodiment the composition of the present has an etch rate of silicon nitride 100 times greater than the composition's etch rate of titanium nitride. In another embodiment, the present invention provides a method of etching a silicon wafer with a composition comprising about 1.0% to about 5.0% by weight hydrogen fluoride (HF), about 45.0% to about 90.00% by weight of a carboxylic acid composition, and about 5.0% to about 50.0% by weight of trifluoroacetic acid anhydride.

For a better understanding of the present invention, together with other and further objects and advantages, reference is made to the following detailed description, taken in conjunction with the accompanying examples, and the scope of the invention will be pointed out in the appended claims. The following detailed description is not intended to restrict the scope of the invention by the advantages set forth above.

DETAILED DESCRIPTION

Principles of the present invention, as manifested in one or embodiments, will be described herein in the content of novel compositions and methods for selectively etching silicon wafers useful in silicon wafer manufacturing and processing methods. It will be appreciated, however, that the invention is not limited to the specific composition(s) and/or method(s) illustratively described herein. Rather it will become apparent to those skilled in the art give the teachings herein that numerous modifications can be made to the embodiments described that are within the scope of the claimed invention. That is no limitations with respect to the embodiments described herein are intended or should be inferred.

Embodiments of the present invention provide a formulation which selectively etches silicon dioxide in preference to aluminum oxide. In another embodiment, the present invention is directed to a formulation and method that is substantially non-aqueous. In still yet another embodiment, the present invention is directed to a formulation and method providing for selective etching of silicon oxide at room temperature.

The aforementioned compositions are preferably non-aqueous or semi-aqueous to achieve enhanced results.

As used herein, the term, "hydrofluoric acid" refers to HF, salts, mixtures, and solutions thereof. Hydrofluoric acid typically is used in an aqueous solution, and any such aqueous solutions may be used in the present invention. In embodiments of the present invention, however, non-aqueous solutions are preferred.

As used herein, the term "carboxylic acid component" refers to a compound containing a carboxyl functional group, such as R—COOH, where R refers to an alkane. In a preferred embodiment, the carboxylic acid component is selected from the group of acetic acid, propionic acid, citric acid, butyric acid, hexanoic acid, or mixtures thereof.

As used herein, the term "non-aqueous" refers to a mostly organic composition, with only minute amount or no water in the composition. In an embodiment, the composition may have 5% or less water by weight. In a preferred embodiment, the composition will have 3% or less water by weight. In a more preferred embodiment, the composition will have less than 1% water by weight.

In an embodiment, the formulation may have trifluoroacetic anhydride in substantial amount which is far more than molar weight needed to remove free water (200-300 mole %). In addition, the excess trifluoroacetic anhydride helps to reduce the etch rate of the silicon oxide which helps to reduce the roughness of the silicon surface and also increases the etch selectivity of silicon oxide relative to aluminum oxide. In an embodiment, formulations of the invention help to increase etch selectivity between silicon and aluminum oxide which in amounts of to 100/1.

EXAMPLES

The present invention is further exemplified, but not limited, by the following representative examples, which are intended to illustrate embodiments of the invention and are not to be construed as being limitations thereto.

Example 1

Concentrated (49%) aqueous hydrogen fluoride (10 ML) is added to a mixture containing acetic acid (400 ML) and trifluoroacetic anhydride (90 ML) to form a formulation which has roughly 1% HF and all the water has been reacted to form trifluoroacetic acid. The effective selectivity of this etch solution is tested by immersion of a substrate having native silicon dioxide and an aluminum oxide junction at room temperature for 2 to 25 minutes. After immersion, the substrate is rinsed with acetic acid followed by water and dried under a stream of nitrogen. Both water contact angle measurement and photoelectron spectroscopy shows that native silicon oxide is completely removed and the resistance of the aluminum junction remains effectively unchanged which indicated high selectivity of this etch solution toward silicon dioxide in preference to aluminum dioxide.

The present compositions and methods have been found to have the following beneficial effects, including extremely high 100:1 selectivity of etching silicon oxide relative to aluminum oxide.

Thus while there have been described what are presently believed to be preferred embodiments of the invention, those skilled in the art will realize that changes and modifications may be made thereto without departing from the spirit of the invention, and it is intended to claim all such changes and modifications as fall within the true scope of the invention.

What is claimed is:

1. A selective etch composition for processing silicon wafers, comprising about 1.0% to about 5.0% by weight hydrogen fluoride (HF), about 45.0% to about 90.0% by weight of a carboxylic acid component, and about 5.0% to about 50.0% by weight of trifluoroacetic acid anhydride.

2. The composition according to claim 1, wherein said trifluoroacetic acid anhydride is present in about 10.0% to about 50.0% by weight.

3. The composition according to claim 1, wherein said trifluoroacetic acid anhydride is present in about 15.0% to about 50.0% by weight.

4. The composition according to claim 1, wherein said hydrogen fluoride is present in said composition from about 2.0% to about 5.0% by weight; said carboxylic acid is present in said composition from about 65.0% to about 80.0% by weight of said composition, and said trifluoroacetic acid is present in said composition from about 15.0% to about 50.0% by weight.

5. The composition according to claim 1, wherein said hydrogen fluoride is present in said composition from about 2.0% to about 5.0% by weight; said carboxylic acid is present in said composition from about 75% to about 78.0% by weight of said composition, and said trifluoroacetic acid is present in said composition from about 20.0% to about 45.0% by weight.

6. The composition according to claim 1, wherein said carboxylic acid is selected from the group of acetic acid, propionic acid, citric acid, butyric acid, hexanoic acid, or mixtures thereof.

7. The composition according to claim 6, wherein said carboxylic acid is acetic acid.

8. The composition according to claim 1, wherein a ratio of said carboxylic acid composition to trifluoroacetic acid is about 10:1 to about 1:1.

9. The composition according to claim 1, wherein a pH of said composition is between about 1 and about 4.

10. The composition according to claim 1, wherein said composition is non-aqueous.

11. The composition according to claim 1, further comprising one or more ingredients selected from the group comprising a pH-adjusting agent, a corrosion control agent, and a surfactant.

12. The composition according to claim 1, wherein said composition selectively removes silicon oxide over aluminum oxide in processing silicon wafers.

13. The composition according to claim 1, wherein said composition has an etch rate of silicon nitride 100 times greater than said composition's etch rate of titanium nitride.

14. The composition according to claim 1, wherein said composition is configured to selectively etch silicon oxide from the silicon wafers at room temperature.

15. A method of etching a silicon wafer with a composition comprising about 1.0% to about 5.0% by weight hydrogen fluoride (HF), about 45.0% to about 90.0% by weight of a carboxylic acid composition, and about 5.0% to about 50.0% by weight of trifluoroacetic acid anhydride.

16. The method of claim 15, further comprising selectively etching silicon oxide from the silicon wafer at room temperature using the composition.

* * * * *